United States Patent
Goel et al.

(10) Patent No.: US 10,468,399 B2
(45) Date of Patent: Nov. 5, 2019

(54) MULTI-CAVITY PACKAGE HAVING SINGLE METAL FLANGE

(71) Applicant: Cree, Inc., Durham, NC (US)

(72) Inventors: Saurabh Goel, San Jose, CA (US); Alexander Komposch, Morgan Hill, CA (US); Cynthia Blair, Morgan Hill, CA (US); Cristian Gozzi, Santa Clara, CA (US)

(73) Assignee: CREE, INC., Durham, NC (US)

( * ) Notice: Subject to any disclaimer, the term of this patent is extended or adjusted under 35 U.S.C. 154(b) by 564 days.

(21) Appl. No.: 14/673,928

(22) Filed: Mar. 31, 2015

(65) Prior Publication Data

US 2016/0294340 A1    Oct. 6, 2016

(51) Int. Cl.
*H01L 23/495* (2006.01)
*H01L 25/00* (2006.01)
(Continued)

(52) U.S. Cl.
CPC .............. *H01L 25/50* (2013.01); *H01L 23/36* (2013.01); *H01L 23/538* (2013.01);
(Continued)

(58) Field of Classification Search
CPC ............ H01R 23/7068; H01R 23/7073; H01R 23/725; H01R 23/70; H01R 23/7078; H01L 23/4093; H01L 23/4006; H01L 23/467; H01L 23/5389; H01L 2023/4062; H01L 2224/48091; H01L 2224/16;
(Continued)

(56) References Cited

U.S. PATENT DOCUMENTS 3,823,467 A  *  7/1974  Shamash ................. H01L 21/00
                                                          216/14
3,986,196 A     10/1976  Decker et al.
(Continued)

FOREIGN PATENT DOCUMENTS

CN     103219317 A    7/2013
CN     103681389 A    3/2014
(Continued)

OTHER PUBLICATIONS

Komposch, et al., "PCB Based RF-Power Package Window Frame", U.S. Appl. No. 13/432,333, filed Mar. 28, 2012. Corresponds to US 20130256858 A1 in the Office Action dated Mar. 17, 2016.
(Continued)

*Primary Examiner* — Daniel Whalen
(74) *Attorney, Agent, or Firm* — Coats & Bennett, PLLC

(57) ABSTRACT

A multi-cavity package includes a single metal flange having first and second opposing main surfaces, a circuit board attached to the first main surface of the single metal flange, the circuit board having a plurality of openings which expose different regions of the first main surface of the single metal flange, and a plurality of semiconductor dies each of which is disposed in one of the openings in the circuit board and attached to the first main surface of the single metal flange. The circuit board includes a plurality of metal traces for electrically interconnecting the semiconductor dies to form a circuit. A corresponding method of manufacturing is also provided.

5 Claims, 8 Drawing Sheets

(51) Int. Cl.
- *H01L 23/66* (2006.01)
- *H01L 23/538* (2006.01)
- *H01L 23/36* (2006.01)
- *H01L 25/065* (2006.01)

(52) U.S. Cl.
CPC .......... *H01L 23/5386* (2013.01); *H01L 23/66* (2013.01); *H01L 25/0655* (2013.01); *H01L 2223/6611* (2013.01); *H01L 2223/6644* (2013.01); *H01L 2223/6655* (2013.01); *H01L 2223/6677* (2013.01); *H01L 2224/48091* (2013.01); *H01L 2224/49175* (2013.01)

(58) Field of Classification Search
CPC ....... H01L 2224/48; H01L 2924/01079; H01L 2924/01078; H01L 2924/14; H01L 2924/01029; H01L 2924/3011; H01L 2924/01013; G06F 1/20; H05K 1/0206; H05K 1/141; H05K 1/189; H05K 1/118; H05K 1/147; H05K 1/182; H05K 1/0306; H05K 1/167; H05K 1/162; H05K 1/092; H05K 3/0061; H05K 3/0058; H05K 3/284; H05K 3/3447; H05K 3/3452; H05K 3/4697; H05K 2201/09781; H05K 2201/2009; H05K 1/0209; H05K 1/183; H05K 7/205

USPC ....... 361/719, 720, 748, 749, 760, 761, 765; 257/699, 732, E23.026; 439/629

See application file for complete search history.

(56) References Cited

U.S. PATENT DOCUMENTS

| | | | |
|---|---|---|---|
| 5,040,996 A * | 8/1991 | Kobold | B60R 16/0238 439/45 |
| 5,182,632 A * | 1/1993 | Bechtel | H01L 23/3675 257/713 |
| 5,414,592 A * | 5/1995 | Stout | H05K 7/20545 165/80.3 |
| 5,438,478 A | 8/1995 | Kondo et al. | |
| 5,728,248 A | 3/1998 | Weber | |
| 5,736,781 A * | 4/1998 | Atsumi | G06K 19/077 257/668 |
| 5,754,402 A * | 5/1998 | Matsuzaki | H01L 23/36 257/711 |
| 5,776,512 A | 7/1998 | Weber | |
| 5,798,014 A | 8/1998 | Weber | |
| 5,843,808 A | 12/1998 | Karnezos | |
| 5,973,389 A | 10/1999 | Culnane et al. | |
| 6,020,636 A | 2/2000 | Adishian et al. | |
| 6,062,089 A * | 5/2000 | Ichihashi | G01L 19/147 73/706 |
| 6,261,868 B1 | 7/2001 | Miller et al. | |
| 6,329,713 B1 | 12/2001 | Farquhar et al. | |
| 6,511,866 B1 | 1/2003 | Bregante et al. | |
| 6,521,982 B1 | 2/2003 | Gillett et al. | |
| 7,298,046 B2 | 11/2007 | Venegas et al. | |
| 7,582,964 B2 | 9/2009 | Venegas et al. | |
| 8,013,429 B2 | 9/2011 | Mohammed et al. | |
| 8,847,680 B2 | 9/2014 | Bowles et al. | |
| 9,077,285 B2 | 7/2015 | Holmes | |
| 2003/0102489 A1 | 6/2003 | Nam et al. | |
| 2003/0151128 A1 | 8/2003 | Kawaguchi | |
| 2004/0262781 A1 | 12/2004 | Germain et al. | |
| 2006/0110859 A1 | 5/2006 | Shigemura et al. | |
| 2008/0019108 A1 * | 1/2008 | Hoyer | H01L 23/3675 361/760 |
| 2009/0051018 A1 * | 2/2009 | Moline | H01L 21/568 257/675 |
| 2010/0032825 A1 | 2/2010 | Elliott et al. | |
| 2012/0231753 A1 * | 9/2012 | Maslennikov | H03F 1/0288 455/249.1 |
| 2012/0286866 A1 * | 11/2012 | Khanifar | H03F 1/3247 330/149 |
| 2012/0293251 A1 | 11/2012 | Chen et al. | |
| 2013/0081867 A1 * | 4/2013 | Masuda | H01L 23/3677 174/260 |
| 2013/0154068 A1 | 6/2013 | Sanchez et al. | |
| 2013/0256858 A1 * | 10/2013 | Komposch | H01L 23/047 257/676 |
| 2014/0070365 A1 | 3/2014 | Viswanathan et al. | |
| 2014/0070881 A1 | 3/2014 | Annes et al. | |
| 2014/0256090 A1 | 9/2014 | Interrante et al. | |
| 2014/0332941 A1 | 11/2014 | Viswanathan et al. | |
| 2015/0002229 A1 | 1/2015 | Kuo et al. | |
| 2015/0102383 A1 * | 4/2015 | Golland | H01L 25/115 257/140 |
| 2015/0303881 A1 * | 10/2015 | Blednov | H03F 3/213 330/289 |
| 2017/0103927 A1 | 4/2017 | Bishop et al. | |

FOREIGN PATENT DOCUMENTS

| | | |
|---|---|---|
| CN | 104037100 A | 9/2014 |
| DE | 10223035 A1 | 12/2003 |
| DE | 102010038246 A1 | 8/2011 |
| EP | 2575167 A2 | 4/2013 |
| JP | H10242377 A | 9/1998 |
| JP | 2003179181 A | 6/2003 |
| JP | 2004200908 A | 7/2004 |
| JP | 4296778 B2 | 7/2009 |
| KR | 10-2001-0027361 A | 4/2001 |

OTHER PUBLICATIONS

Bessemoulin, A., et al., "A 1-Watt Ku-band Power Amplifier MMIC Using Cost-Effective Organic SMD Package", 34th European Microwave Conference; Amsterdam, 2004, pp. 349-352.

Everett, J.P., et al., "Optimization of LDMOS Power Transistors for High Power Microwave Amplifiers Using Highly Efficient Physics-Based Model", Proceedings of the 6th European Microwave Integrated Circuits Conference; Manchester, UK, Oct. 10-11, 2011, pp. 41-44.

\* cited by examiner

MULTI-CAVITY PACKAGE HAVING SINGLE METAL FLANGE

TECHNICAL FIELD

The present application relates to power semiconductor packages, in particular power semiconductor packages with multiple semiconductor dies.

BACKGROUND

In highly space-constrained systems, multi-stage power amplifier designs are typically implemented using integrated circuit (IC) technology which has several limitations that make its use unattractive in many cases. For example, the design time and process flow to make an IC is very long which in-turn increases the overall product turnaround time. Also, the inter-stage match between different amplifier stages is provided on the chip (die) with IC technology and because of the proximity of bond-wires and resulting coupling mechanisms, an IC has a very high tendency to be unstable and hence unusable. Furthermore, IC processing involves expensive semiconductor fabrication processes which increase the design and development cost to make such products. In addition, conventional multi-stage power amplifier IC designs provide at most about 30 dB gain. Any higher gain increases the risk of power amplifier IC instability and hence renders the IC unusable.

SUMMARY

According to an embodiment of a multi-cavity package, the multi-cavity package comprises a single metal flange having first and second opposing main surfaces, a circuit board attached to the first main surface of the single metal flange, the circuit board having a plurality of openings which expose different regions of the first main surface of the single metal flange, and a plurality of semiconductor dies each of which is disposed in one of the openings in the circuit board and attached to the first main surface of the single metal flange. The circuit board comprises a plurality of metal traces for electrically interconnecting the semiconductor dies to form a circuit.

According to an embodiment of a method of manufacturing a multi-cavity package, the method comprises: providing a single metal flange having first and second opposing main surfaces; attaching a circuit board to the first main surface of the single metal flange, the circuit board having a plurality of openings which expose different regions of the first main surface of the single metal flange; placing a plurality of semiconductor dies in the openings of the circuit board; attaching the semiconductor dies to the first main surface of the single metal flange; and electrically interconnecting the semiconductor dies through a plurality of metal traces of the circuit board to form a circuit.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described next are embodiments of a multi-stage power amplifier circuit provided on a single metal flange. The input of the final RF power transistor die (chip) is matched to the output of the driver RF power transistor die using circuit board technology such as PCB (printed circuit board) or components such as inductors, capacitors, resistors etc. for implementing the inter-stage match. The single metal flange can have two or more power amplifier stages attached to the flange. Such a configuration enables higher gain in a smaller area e.g. more than 35 dB gain (for two stages) while reducing amplifier instability concerns. For a higher number of stages, the gain provided can be around 45 dB or even greater.

The embodiments described herein enable manufacture of a packaged Doherty amplifier circuit device with main and peaking amplifier dies attached to a single metal flange along with a Doherty combiner on the output side of the package. Such a configuration saves space and reduces design complexity for the user base-station design. Such a design can be applied to other applications of transmitters as well.

In each case, the multi-stage package design embodiments described herein enable high gain devices using a multi-cavity package where the dielectric is comprised out of PCB or similar dielectric material such as Teflon, ceramic, LTCC, polyimide, etc. and which simplifies user design by integrating RF power amplifier functionality at the package level, such as output matching for Doherty amplifier design, input match, driver+input+output match, etc. The leads/terminals of the multi-stage power amplifier package described herein can be soldered down onto the application board without requiring additional connectors for the signal path. The single metal flange can be soldered or screwed down depending on the application manufacturing practice. The multi-stage power amplifier package is an open cavity package design, and a lid can be provided for protecting the interconnects and circuit components.

Figure 1:
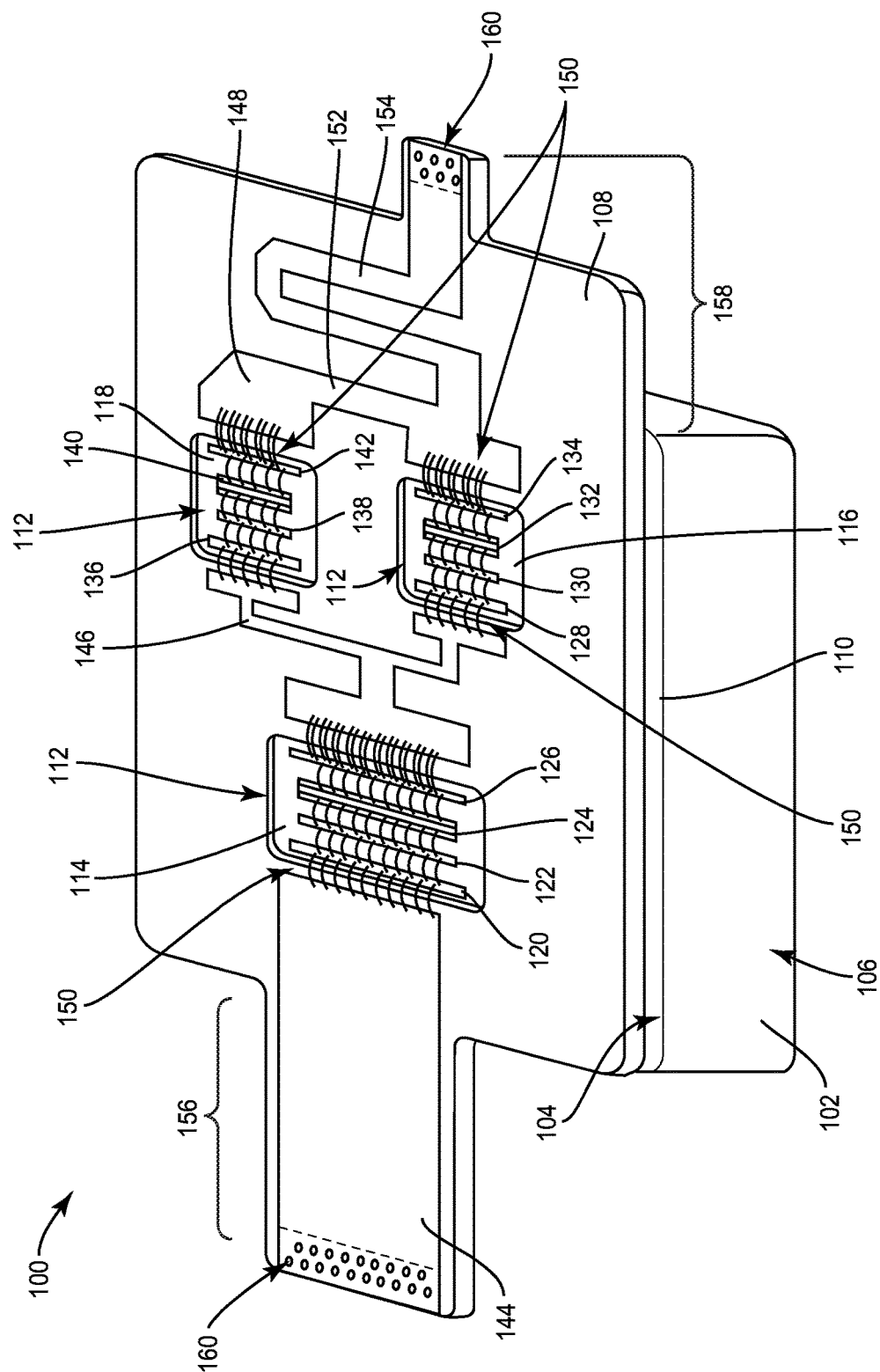
FIG. 1 illustrates a top side perspective view of an embodiment of a multi-cavity package.

FIG. 1 illustrates a top side perspective view of an embodiment of a multi-cavity package 100. The multi-cavity package 100 comprises a single metal flange 102 having first and second opposing main surfaces 104, 106 and a circuit board 108 such as a PCB attached to the first main surface 104 of the single metal flange 102. The single metal flange 102 can comprise Cu, CPC (copper, copper-molybdenum, copper laminate structure) CuW, or any similar alloy, etc.

The circuit board 108 can be attached to the first main surface 104 of the single metal flange 102 by and standard circuit board attach process such as gluing, soldering, sintering, brazing, etc. The circuit board 108 mechanically supports and electrically connects electronic components using conductive traces (also referred to as tracks), pads and other features etched from metal (e.g. copper) sheets laminated onto a non-conductive substrate 110. The circuit board 108 can be single sided (one metal layer), double sided (two metal layers) or multi-layer. Conductors on different layers are connected with plated-through holes called vias. The circuit board 108 can contain components such as capacitors, resistors, active devices, etc. embedded in the non-conductive substrate 110. The circuit board 108 also has a plurality of openings 112 which expose different regions 114, 116, 118 of the first main surface 104 of the single metal flange 102.

The multi-cavity package 100 further comprises a plurality of semiconductor dies 120-142, each of which is disposed in one of the openings 112 in the circuit board 108 and attached to the first main surface 104 of the single metal flange 102 via a die attach material (out of view) such as solder, diffusion soldering, sintering, adhesive, etc. For example, the semiconductor dies 120-142 can be attached to the single metal flange 102 using soft solder, a eutectic die attach material such as AuSi or AuSn, an organic adhesive, etc. Metal traces 144, 146, 148 of the circuit board 108 electrically interconnect the semiconductor dies 120-142 and the external electrical terminals to form a circuit. For example, wire bonds 150 can electrically connect respective ones of the metal traces 144, 146, 148 to different terminals of the semiconductor dies 120-142 to form the desired circuit.

Some or all of the semiconductor dies 120-142 can be active semiconductor dies such as power transistor dies, power diode dies, etc. and/or contain passive components such as capacitors, inductors and resistors. Each active semiconductor die 124, 132, 140 can be a lateral or vertical device or some other form of transistor used for amplification.

In the case of a vertical device, the current flow direction is between the bottom and top sides of the die. The transistor die may have three terminals. For example, the bottom side of the die can be a power terminal such as the source of a power MOSFET (metal oxide semiconductor field effect transistor), or collector of an IGBT (insulated gate bipolar transistor), or anode/cathode of a power diode. The power terminal is attached to the region 114/116/118 of the single metal flange 102 which is exposed by the corresponding opening 112 in the circuit board 108 e.g. by diffusion soldering. The gate and drain/emitter terminals in the case of a transistor die or the cathode/anode terminal in the case of a power diode die are disposed at the opposite side of the die i.e. the side facing away from the single metal flange 102.

In the case of a lateral device, the current flow direction is horizontal and the bottom side of the die is not active. The respective drain or collector terminal of such a device has interconnects on the top side, as well. The circuit board 108 would then still connect the drain and gate terminal or equivalent control terminals on top of the semiconductor die. The top-side terminals of the semiconductor dies 120-142 can be attached to the to-side terminals of an adjacent die or to one of the circuit board metal traces 144, 146, 148 e.g. through wire bonds 150.

One or more of the semiconductor dies 120-142 disposed in the openings 112 formed in the circuit board 108 can be a passive semiconductor die devoid of active devices such as a capacitor, resistor or an inductor die. In the case of a capacitor die 120, 122, 126, 128, 130, 134, 136, 138, 142, one of the capacitor terminals is at the bottom side of the capacitor die and attached to the single metal flange 102. The other capacitor terminal is disposed at the opposite side of the capacitor die i.e. the side facing away from the single metal flange 102.

The multi-cavity package 100 can be enclosed with an optional lid so that the package is an open-cavity package. The multi-cavity package 100 allows for a simplified product and development process by using multiple openings (cut-outs) 112 in the circuit board 108 such that the circuit board 108 provides openings 112 through which passive and/or active components are attached to the single metal flange 102. For example in the case of two openings 112 in the circuit board 108, the circuit board 108 provides two cavities to die attach active/passive components to the single metal flange 102. As such, a two-stage high gain amplifier device can be provided on the same metal flange 102 by disposing the drive stage die in one of the circuit board openings 112 and the final stage die in the other opening 112. For such a two stage amplifier design, instead of developing the inter-stage match using a semiconductor technology such as silicon, the multi-cavity package 100 described herein enables the inter-stage match design using transmission lines formed from the circuit board metal traces 144, 146 148 and passive components mounted in the cavity or on the board and that results in significantly reduced development time. Designing circuit board based inter-stage match topologies reduces the cost of the overall product development process because expensive silicon processing is not required. Furthermore, the multi-cavity package 100 allows customized solutions for different applications by having more cavities/openings 112 in the circuit board 108. For example, a phase shifter and/or an attenuator can be formed from one or more of the circuit board metal traces 144, 146 148. Such an implementation enables a dual-path independently controlled driver and Doherty power amplifier device.

According to the multi-cavity package embodiment shown in FIG. 1, one of the semiconductor dies 124 is a driver stage die of a Doherty amplifier circuit, a second one of the semiconductor dies 132 is a main (or carrier) amplifier die of the Doherty amplifier circuit, and a third one of the semiconductor dies 140 is a peaking amplifier die of the Doherty amplifier circuit. Passive semiconductor dies 120, 122, 126, 128, 130, 134, 136, 138, 142 which form part of various match networks of the Doherty amplifier circuit such as input and output match networks also can be placed in the circuit board openings 112 and attached to the single metal flange 102 as shown in FIG. 1.

One of the circuit board metal traces 146 forms an inter-stage match between the output of the driver stage die 124 and the input of the main amplifier die 132 and the input of the peaking amplifier die 140. A second one of the circuit board metal traces 148 forms a Doherty combiner electrically connected to the output of the main amplifier die 132 and the output of the peaking amplifier die 140. A third one of the circuit board metal traces 144 electrically connects the external terminal to the input of the driver stage die 124. The third metal trace 144 can be shaped to form a phase shifter, attenuator, etc. at the input of the driver stage die 124. As such, the multi-cavity package 100 shown in FIG. 1 has the main and peaking devices (separated with a ground shield for better isolation) on a single metal flange 102 along with a Doherty combiner 148 on the package.

The two signals output by the Doherty amplifiers 132, 140 are out of phase by 90 degrees. The Doherty combiner 148 can include a λ/4 (quarter wave) transmission line 152 connected to the output of the peaking amplifier 140. By doing so, the Doherty amplifier outputs are brought back into phase and reactively combined. At this point, the two signals in parallel create a Z0/2 impedance where Z0 corresponds to the load impedance. The Doherty combiner 148 can further include a λ/4 (quarter wave) transformer 154 for stepping this impedance to Z0. In a fifty ohm system, the transformer 154 would be 35.35 ohms. The Doherty combiner 148 can be implemented as printed transmission lines on the circuit board. The transformer 154 could be other impedance depending upon the impedance required at the terminal 160.

By implementing the Doherty combiner on the circuit board 108, the impact of package parasitics on amplifier performance is reduced. Also, interface related losses between the multi-cavity package 100 and the main system board are reduced as are inconsistencies in high volume production environment, all while guarding against low yield impact. As such, the overall circuit board size can be reduced and the overall amplifier design simplified.

The circuit board 108 can have at least one lateral extension 156, 158 which overhangs the single metal flange 102 to form an interface for attaching the multi-cavity package 100 to another structure such as another PCB, metal flange, etc. According to the embodiment shown in FIG. 1, the circuit board 108 has opposing first and second lateral extensions 156, 158 each of which overhangs the single metal flange 102 to form two opposing interfaces for attaching the multi-cavity package 100 to one or more structures at opposing ends of the multi-cavity package 100. The output metal trace 148 of the circuit board 108 can extend onto the lateral extension 158 at the output side of the multi-cavity package 100 and/or the input metal trace 144 of the circuit board 108 can extend onto the lateral extension 156 at the input side of the multi-cavity package 100. The output metal trace 148 provides an output electrical pathway for the Doherty amplifier circuit, and the input metal trace 144 provides an input electrical pathway for the circuit. Each metal trace 144, 148 which extends onto one of the lateral extensions 156, 158 can have a plurality of plated-through holes called vias 160 which extend through the corresponding lateral extension 156, 158. The vias 160 provide input/output points of connection to the main system board (not shown). For example, the main system board can be soldered to the corresponding vias 160 of the multi-cavity package 100. The connection can also be provided by soldering the trace or using a single (large) filled via.

Figure 2:
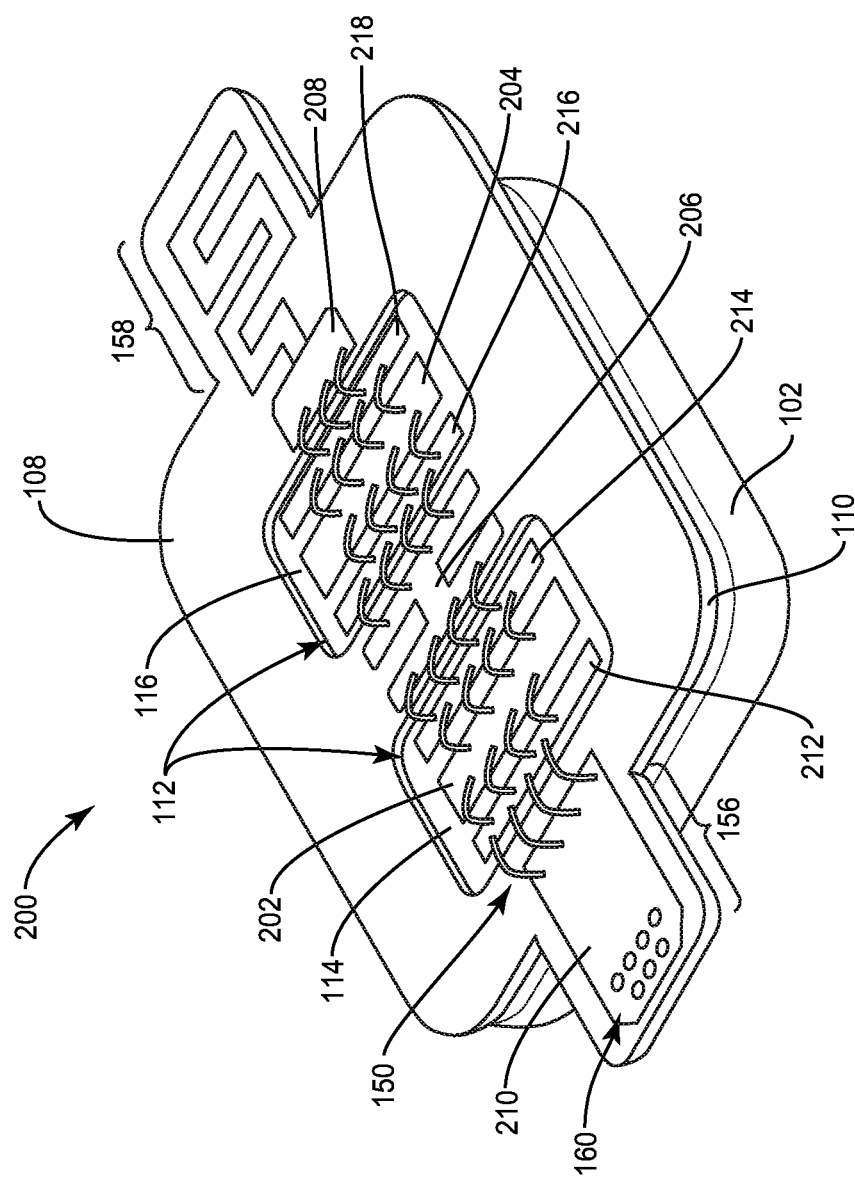
FIG. 2 illustrates a top side perspective view of another embodiment of a multi-cavity package.

FIG. 2 illustrates a top side perspective view of another embodiment of a multi-cavity package 200. The multi-cavity package embodiment shown in FIG. 2 is similar to the embodiment shown in FIG. 1. Different, however, a first one of the semiconductor dies is a driver stage die 202 of a power amplifier circuit and a second one of the semiconductor dies is a power or final stage die 204 of the power amplifier circuit. One of the metal traces 206 of the circuit board 108 forms an inter-stage match between the output of the driver stage die 202 and the input of the power stage die 204. A second one of the circuit board metal traces 208 is electrically connected to the output of the power stage die 204, and a third one of the circuit board metal traces 210 is electrically connected to the input of the driver stage die 202. In the case of an RF power amplifier circuit, the second metal trace 208 can be shaped in the form of an antenna which transmits an RF signal output by the power stage die 204. One or more of the semiconductor dies disposed in the openings 112 formed in the circuit board 108 can be passive semiconductor dies 212, 214, 216, 218 such as capacitor dies as previously described herein, which form part of the power amplifier circuit.

Figure 3:
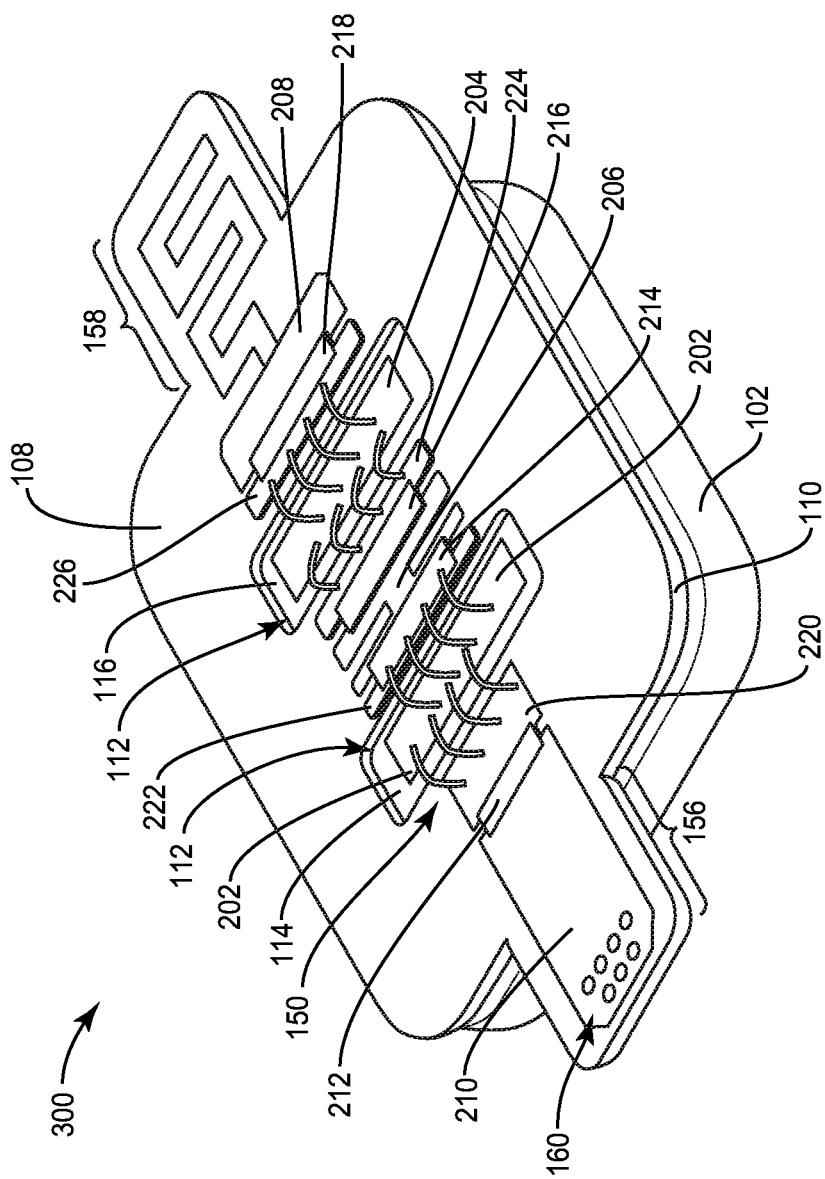
FIG. 3 illustrates a top side perspective view of yet another embodiment of a multi-cavity package.

FIG. 3 illustrates a top side perspective view of yet another embodiment of a multi-cavity package 300. The multi-cavity package embodiment shown in FIG. 3 is similar to the embodiment shown in FIG. 2. Different, however, at least some of the semiconductor dies have a surface mount configuration in that these dies can be mounted or placed directly onto metal traces 206, 208, 210, 220, 222, 224, 226 of the circuit board 108. For example, at least some of the passive components that make up the circuit such as the capacitor dies 212, 214, 216, 218 can be surface-mounted directly onto the metal traces 206, 208, 210, 220, 222, 224, 226 of the circuit board 108 instead of the single metal flange 102.

FIGS. 4A through 4D illustrate an embodiment of a method of manufacturing a multi-cavity package.

Figure 4A:
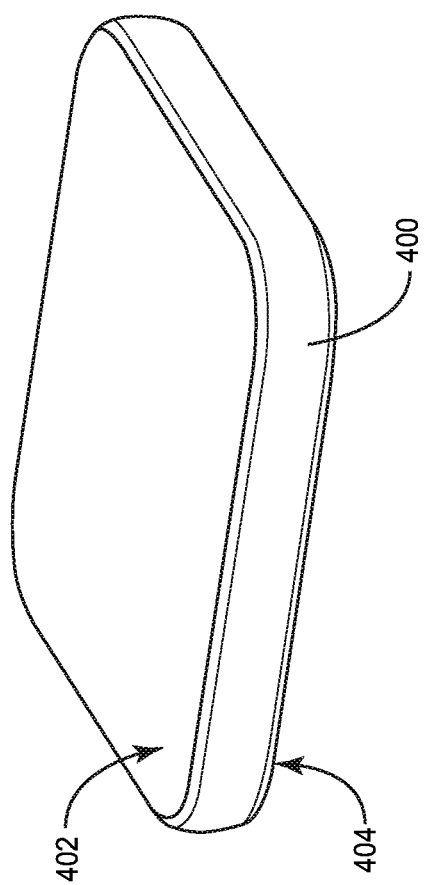
FIGS. 4A through 4D illustrate an embodiment of a method of manufacturing a multi-cavity package.

In FIG. 4A, a single metal flange 400 is provided which has first and second opposing main surfaces 402, 404. The single metal flange 400 can comprise Cu, CPC (copper, copper-molybdenum, copper laminate structure) CuW, or any other suitable alloy, etc.

Figure 4B:
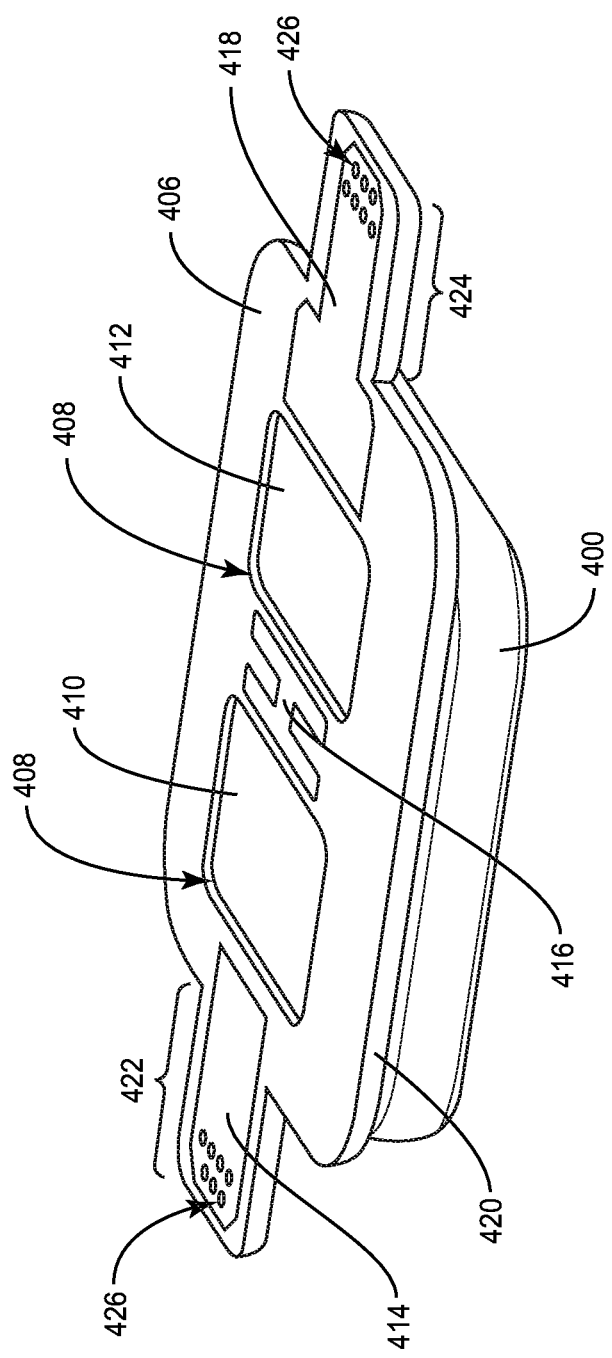

In FIG. 4B, a circuit board 406 such as a PCB is attached to the first main surface 402 of the single metal flange 404 e.g. by gluing, soldering, sintering, brazing, etc. The circuit board 406 has a plurality of openings (cutouts) 408 which expose different regions 410, 412 of the first main surface 402 of the single metal flange 400. The circuit board 406 also has conductive traces (tracks) 414, 416, 418 etched from metal (e.g. copper) sheets laminated onto a non-conductive substrate 420. The circuit board 406 also can have at least one lateral extension 422, 424 which overhangs the single metal flange 400 to form an attachment interface. The input and/or output metal traces 414, 418 of the circuit board 406 can extend onto the corresponding lateral extension 422, 424 and can each have a plurality of plated-through holes (vias) 426 or a single (large) via which extend through the corresponding lateral extension 422, 424 to provide input/output points of connection to the main system board (not shown) as previously described herein. Alternatively or in addition, the connection can be provided by soldering the lateral extensions 422, 424 directly to the main system board.

Figure 4C:
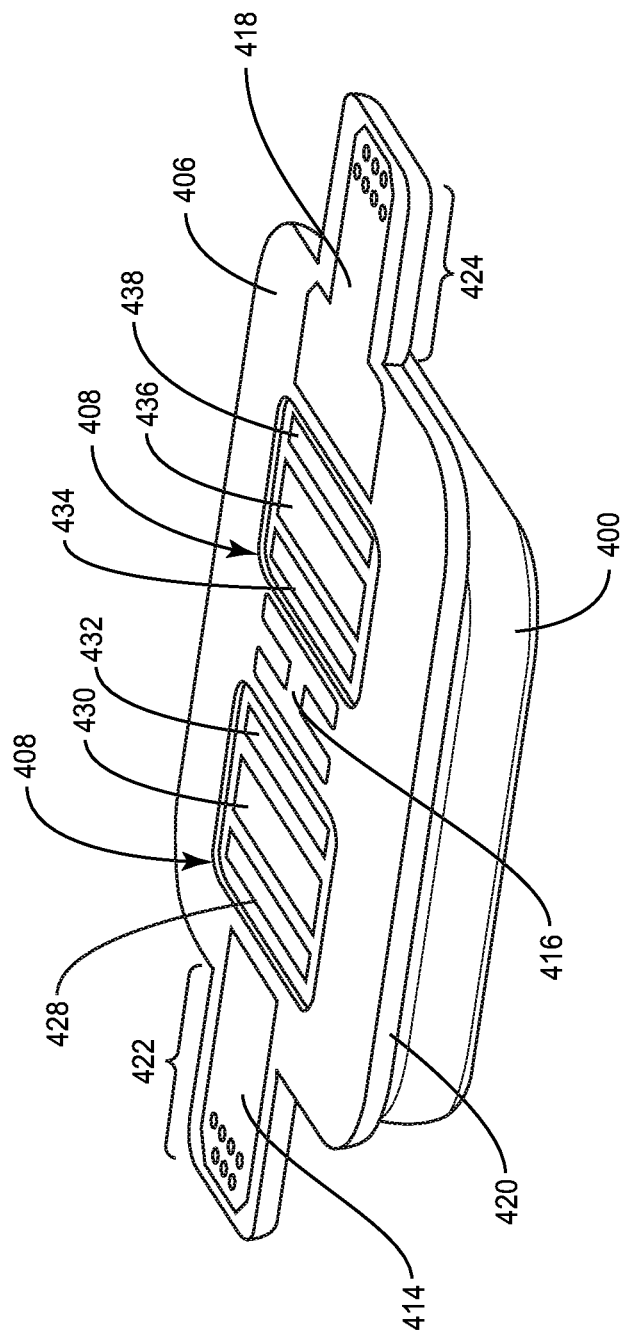

In FIG. 4C, a plurality of semiconductor dies 428-438 are placed in the openings 408 in the circuit board 406. Some or all of the semiconductor dies 428-438 are vertical and/or lateral active semiconductor dies such as power transistor dies, power diode dies, etc. and the remainder of the die(s) are passive dies such as capacitor dies as previously described herein.

Figure 4D:
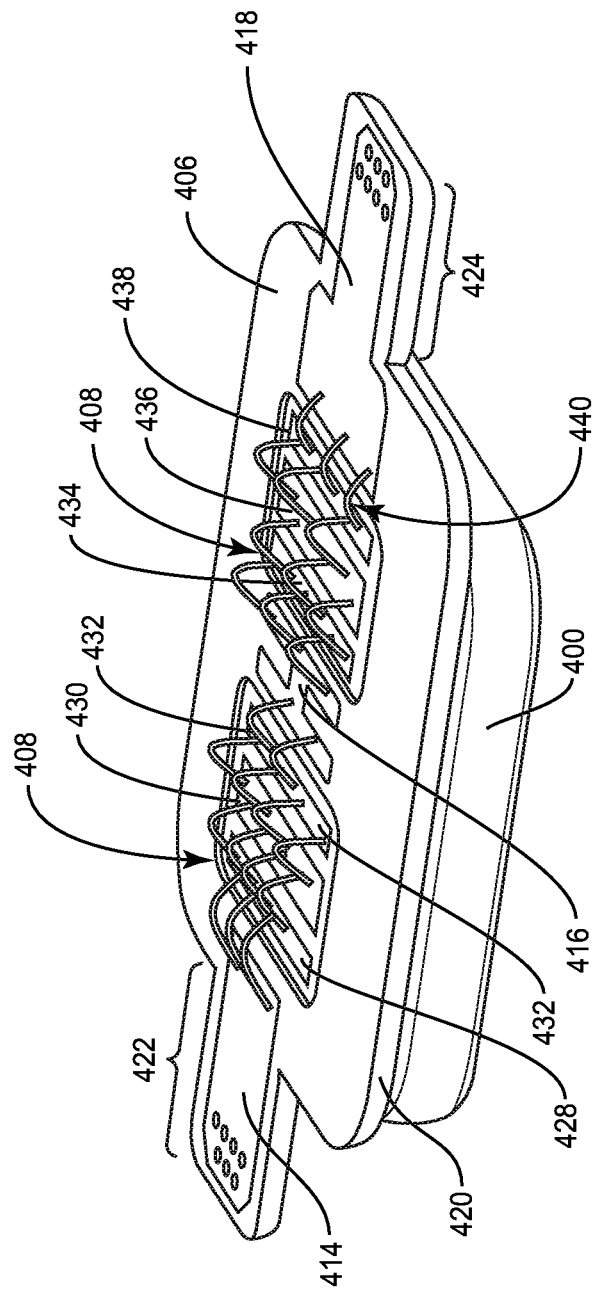

In FIG. 4D, the semiconductor dies 428-438 are attached to the first main surface 402 of the single metal flange 400 via a die attach material such as solder, diffusion soldering, sintering, adhesive, etc. Also, the semiconductor dies 428-438 are electrically interconnected through the metal traces 414, 416, 418 of the circuit board and wire bonds 440 or other types of electrical conductors to form a circuit such as a Doherty amplifier circuit, a power amplifier circuit, etc.

Figure 5:
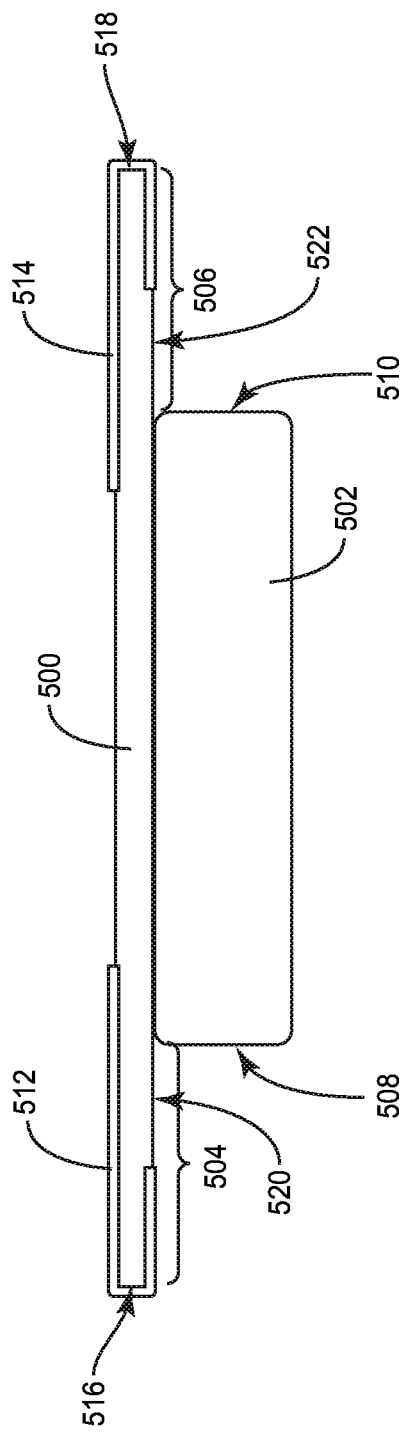
FIG. 5 illustrates a side perspective view of an embodiment of a single metal flange and circuit board configuration for a multi-cavity package.

FIG. 5 illustrates a side perspective view of an embodiment of a single metal flange and circuit board configuration for a multi-cavity package. The semiconductor dies and wire bond connections typically provided as part of the package are omitted in FIG. 5 for ease of illustration. Similar to the multi-cavity package embodiments previously described herein, a circuit board 500 is attached to a single metal flange 502. The circuit board 500 has at least one lateral extension 504, 506 which overhangs a respective edge face 508, 510 of the single metal flange 502 to form an attachment interface for the package. The circuit board 500 has input and/or output metal traces 512, 514 which extend onto the corresponding lateral extension 504, 506. The input and/or output metal traces 512, 514 further extend onto respective edge faces 516, 518 and optionally onto respective bottom faces 520, 522 of the corresponding lateral extension 504, 506 to provide input/output points of connection to a main system board (not shown). For example, each lateral extension 504, 506 of the circuit board 500 can be soldered to the main system board along the edge face 516/518 and optionally along the bottom face 520/522 of the corresponding input/output metal trace 512, 514.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A multi-cavity package, comprising:
   a single metal flange having first and second opposing main surfaces;
   a circuit board attached to the first main surface of the single metal flange, the circuit board having a lateral extension which overhangs the single metal flange, a first surface facing the single metal flange, a second surface facing away from the first surface, and a plurality of openings which expose different regions of the first main surface of the single metal flange; and
   a plurality of semiconductor dies each of which is disposed in one of the openings in the circuit board and attached to the first main surface of the single metal flange;
   wherein the circuit board comprises a plurality of metal traces for electrically interconnecting the semiconductor dies to form a circuit;
   wherein the metal traces form a single layer disposed on the second surface of the circuit board;
   wherein a given one of the metal traces extends onto the lateral extension and provides an input or output electrical pathway for the circuit; and
   wherein at least one of the semiconductor dies is an amplifier die.

2. The multi-cavity package of claim 1, wherein the given one of the metal traces comprises at least one via which extends through the lateral extension.

3. The multi-cavity package of claim 1, wherein the given one of the metal traces also extends onto an edge face of the lateral extension.

4. The multi-cavity package of claim 3, wherein the given one of the metal traces extends from the edge face onto a bottom face of the lateral extension adjacent the single metal flange.

5. A method of manufacturing a multi-cavity package, the method comprising:
   providing a single metal flange having first and second opposing main surfaces;
   attaching a circuit board to the first main surface of the single metal flange, the circuit board having a lateral extension which overhangs the single metal flange, a first surface facing the single metal flange, a second surface facing away from the first surface, and a plurality of openings which expose different regions of the first main surface of the single metal flange;
   placing a plurality of semiconductor dies in the openings of the circuit board;
   attaching the semiconductor dies to the first main surface of the single metal flange; and
   electrically interconnecting the semiconductor dies through a plurality of metal traces of the circuit board to form a circuit, wherein the metal traces form a single layer disposed on the second surface of the circuit board, and wherein at least one of the semiconductor dies is an amplifier die;
   wherein a given one of the metal traces extends onto the lateral extension and provides an input or output electrical pathway for the circuit.

* * * * *